United States Patent
Cideciyan et al.

(10) Patent No.: US 7,030,789 B1
(45) Date of Patent: Apr. 18, 2006

(54) TECHNIQUES FOR APPLYING MODULATION CONSTRAINTS TO DATA USING PERIODICALLY CHANGING SYMBOL MAPPINGS

(75) Inventors: Roy D. Cideciyan, Ruschlikon (CH); Evangelos S. Eleftheriou, Zurich (CH); Richard Leo Galbraith, Rochester, MN (US); Thomas Mittelholzer, Zurich (CH); Travis Oenning, Rochester, MN (US)

(73) Assignee: Hitachi Global Storage Technologies Netherlands B.V., Amsterdam (NL)

(*) Notice: Subject to any disclaimer, the term of this patent is extended or adjusted under 35 U.S.C. 154(b) by 0 days.

(21) Appl. No.: 11/002,970

(22) Filed: Dec. 1, 2004

(51) Int. Cl.
*H03M 7/02* (2006.01)

(52) U.S. Cl. .......................... 341/83; 341/81; 341/50; 714/778; 714/784

(58) Field of Classification Search .................. 341/51, 341/83, 81, 82, 50, 59, 58; 714/769, 778, 714/784, 756
See application file for complete search history.

(56) References Cited

U.S. PATENT DOCUMENTS

| | | | |
|---|---|---|---|
| 4,707,681 A | 11/1987 | Eggenberger et al. | |
| 4,818,969 A | 4/1989 | Krakauer et al. | |
| 5,241,309 A | 8/1993 | Cideciyan et al. | |
| 5,311,521 A | 5/1994 | Fitingof et al. | |
| 5,757,294 A | 5/1998 | Fisher et al. | |
| 5,757,822 A | 5/1998 | Fisher et al. | |
| 5,760,718 A | 6/1998 | Schouhamer Immink | |
| 6,009,549 A * | 12/1999 | Bliss et al. | 714/769 |
| 6,018,304 A | 1/2000 | Bessios | |
| 6,236,340 B1 * | 5/2001 | Patapoutian et al. | 341/58 |
| 6,417,788 B1 | 7/2002 | McEwen et al. | |
| 6,557,124 B1 | 4/2003 | Cideciyan et al. | |
| 6,959,412 B1 * | 10/2005 | Silvus et al. | 714/778 |

OTHER PUBLICATIONS

"Circuitry for Performing Error Correction Calculations on Baseband Encoded Data to Eliminate Error Propagtion", IBM Technical Disclosure Bulletin, Mar. 1981.
Campello de Souza et al., "Constrained Systems with Unconstrained Positions", IEEE Transactions on Information Theory, vol. 48, No. 4, Apr. 2002.
Cideciyan et al., "A PRML system for digital magnetic recording", IEEE Journal on Selected Areas in Communication, vol. 10, No. 1, Jan. 1992.
Cideciyan et al., "Maximum Transition Run Codes for Generalized Partial Response Channels", IEEE Journal on Selected Areas in Communications, vol. 19, No. 4, Apr. 2001.

(Continued)

*Primary Examiner*—John B Nguyen
(74) *Attorney, Agent, or Firm*—Townsend and Townsend and Crew LLP

(57) ABSTRACT

Techniques are provided for applying modulation constraints to data by using periodically changing symbol mappings to replace certain prohibited error prone data patterns. Initially, user data in a first base is mapped to integers of a second base using a base conversion technique. The integers in the second base correspond to symbols. Subsequently, periodically changing symbol mappings are performed during which prohibited symbols generated during base conversion are mapped to permitted symbols. The periodically changing symbol mappings occur in multiple phases, and the prohibited symbols are different in each phase. The resulting data is processed by a precoder in some embodiments.

25 Claims, 8 Drawing Sheets

OTHER PUBLICATIONS

Coker et al., "Implementation of PRML in a rigid disk drive", IEEE Transactions on Magnetics, vol. 27, No. 6, Nov. 1991.

Coker et al., "Noise-Predictive Maximum Likelihood (NPML) Detection", IEEE Transactions on Magnetics, vol. 34, No. 1, Jan. 1998.

Cover, "Enumerative Source Encoding", IEEE Transactions on Information Theory, vol. IT-19, No. 1, Jan. 1973.

Eleftheriou et al., "Noise-predictive maximum-likelihood (NPML) detection for the magnetic recording channel", IEEE 1996, no date.

Kautz, "Fibonacci Codes for Synchronization Control", IEEE Transactions on Information Theory, Apr., no year.

Mansuripur, "Enumerative Modulation Coding with Arbitrary Constraints and Post-Modulation Error Correction Coding for Data Storage Systems", SPIE vol. 1499 Optical Data Storage, 1991, no date.

Moon et al., "Maximum Transition Run Codes for Data Storage Systems", IEEE Transactions on Magnetics, vol. 32, No. 5, Sep. 1996.

Schouhamer Immink et al., "Codes for Digital Recorders", IEEE Transactions on Information Theory, vol. 44, No. 6, Oct. 1998.

Schouhamer Immink, "A Practical Method for Approaching the Channel Capacity of Constrained Channels", IEEE Transactions on Information Theory, vol. 43, No. 5, Sep. 1997.

Tang et al., "Block Codes for a Class of Constrained Noiseless Channels", Information and Control 17, 1970, no date.

Wijngaarden et al., "Efficient Error Control Schemes for Modulation and Synchronization Codes", IEEE 1998, no date.

Wijngaarden et al., "Maximum Runlength-Limited Codes with Error Control Capabilities", IEEE Journal on Selected Areas in Communications, vol. 19, No. 4, Apr. 2001.

* cited by examiner

RS encoder output:

Partial symbol interleaver output:

FIG. 5A

RS encoder output:

Partial symbol interleaver output:

FIG. 5B

TECHNIQUES FOR APPLYING MODULATION CONSTRAINTS TO DATA USING PERIODICALLY CHANGING SYMBOL MAPPINGS

BACKGROUND OF THE INVENTION

The present invention relates to techniques for applying modulation constraints to data to eliminate data patterns prone to read errors, and more particularly, to techniques for ensuring that specific prohibited symbols do not occur periodically.

A disk drive can write data bits onto a data storage disk such as a magnetic hard disk. The disk drive can also read data bits that have been stored on a data disk. Certain data patterns are difficult to write onto a disk and often cause errors when the data patterns are read back. Long sequences of consecutive zeros or consecutive ones (e.g., 40 consecutive zeros) are examples of data patterns that are prone to errors. A long sequence of alternating polarity bits (010101010 . . . ) is another example of an error prone data pattern.

Therefore, it is desirable to eliminate error prone patterns in channel input data. Eliminating error prone patterns ensures reliable operation of the detector and timing loops in a disk drive system. One way to eliminate error prone data patterns is to substitute these data patterns with data patterns that are less likely to cause errors. The substitute symbols can be stored in memory in lookup tables. Lookup tables, however, are undesirable for performing substitutions of data patterns with a large number of bits, because they require a large amount of memory.

Many disk drives have a modulation encoder that uses modulation codes to eliminate error prone data patterns. Modulation encoders impose global and/or interleaved constraints on data to eliminate certain data patterns. A global G constraint at the input of a $1/(1+D^2)$ precoder prohibits data patterns with more than G consecutive zeros. An interleaved I constraint at the input of a $1/(1+D^2)$ precoder prohibits data patterns with more than I consecutive zeros in an even or odd interleave.

Modulation codes, also known as constrained codes, have been widely used in magnetic and optical data storage to eliminate sequences that are undesired for the processes of recording and reproducing digital data. Various classes of modulation codes are used in practice. For example, peak detection systems employing run length-limited RLL(d,k) constrained codes, such as rate-1/2 RLL(2,7) and rate-2/3 RLL(1,7) codes, have been predominant in digital magnetic storage at low normalized linear densities.

At moderate normalized linear densities, the introduction of partial-response maximum-likelihood (PRML) detection channels into data storage required a different type of constrained codes. This class of codes, which are known as PRML(G,I) codes, facilitates timing recovery and gain control, and limits the path memory length of the sequence detector, and therefore the decoding delay, without significantly degrading detector performance. PRML(G,I) codes are used in conjunction with $1/(1+D^2)$ precoders and noise-predictive maximum likelihood (NPML) channels, which generalize the PRML concept.

More recently, maximum transition run (MTR) codes, in particular MTR(j,k) and MTR(j,k,t) codes, have been introduced to provide coding gain for noise-predictive maximum likelihood channels. MTR codes, which are used in conjunction with $1/(1+D)$ precoders, improve detector performance by eliminating or reducing the occurrence of dominant error events at the output of the sequence detector at the expense of increasing the baud rate and incorporating the j-constraint into the detector by implementing a time-varying trellis.

Many prior art techniques for using modulation codes to reduce the occurrence of errors require a high latency time. Therefore, it would be desirable to provide alternative modulation encoding techniques for eliminating error prone data patterns that reduce the latency time.

BRIEF SUMMARY OF THE INVENTION

The present invention provides techniques for applying modulation constraints to data by replacing certain prohibited error prone data patterns using periodically changing symbol mappings. The techniques of the present invention are application to reverse concatenation encoding schemes.

Initially, user data in a first base is mapped to integers of a second base using a base conversion technique. The integers in the second base correspond to symbols.

Subsequently, periodically changing symbol mappings are performed during which prohibited symbols generated during base conversion are mapped to permitted symbols. The periodically changing symbol mappings occur in multiple phases, and the prohibited symbols are different in each phase. The resulting data is processed by a precoder in some embodiments.

According to one embodiment of the present invention, the input data is separated into even and odd interleaves. Radix conversion and then symbol substitution are performed on subsets of the even and odd interleaves. The resulting data is then recombined with the separated bits. The combined data is then processed by a precoder.

According to another embodiment of the present invention, a partial interleaver interleaves the Reed-Solomon (RS) parity symbols in between groups of the RS data symbols in a way that achieves the best modulation constraints of the resulting data.

Other objects, features, and advantages of the present invention will become apparent upon consideration of the following detailed description and the accompanying drawings, in which like reference designations represent like features throughout the figures.

BRIEF DESCRIPTION OF THE DRAWINGS

FIGS. 5A–5B illustrate techniques interleaving Reed-Solomon (RS) parity symbols in between groups of the RS data symbols in a way that achieves the best modulation constraints of the resulting data, according to embodiments of the present invention.

DETAILED DESCRIPTION OF THE INVENTION

Reverse concatenation is a coding technique that employs an efficient modulation encoder followed by a systematic Reed-Solomon (RS) encoder and a post-RS modulation encoder for RS parity symbols. Reverse concatenation architectures that have efficient pre-RS modulation codes may employ large block sizes. Reverse concatenation architectures do not suffer from error propagation, because the modulation decoder for these efficient codes follows the RS decoder. Soft information from the detector or inner parity decoder is readily provided to the ECC decoder.

Figure 1A:
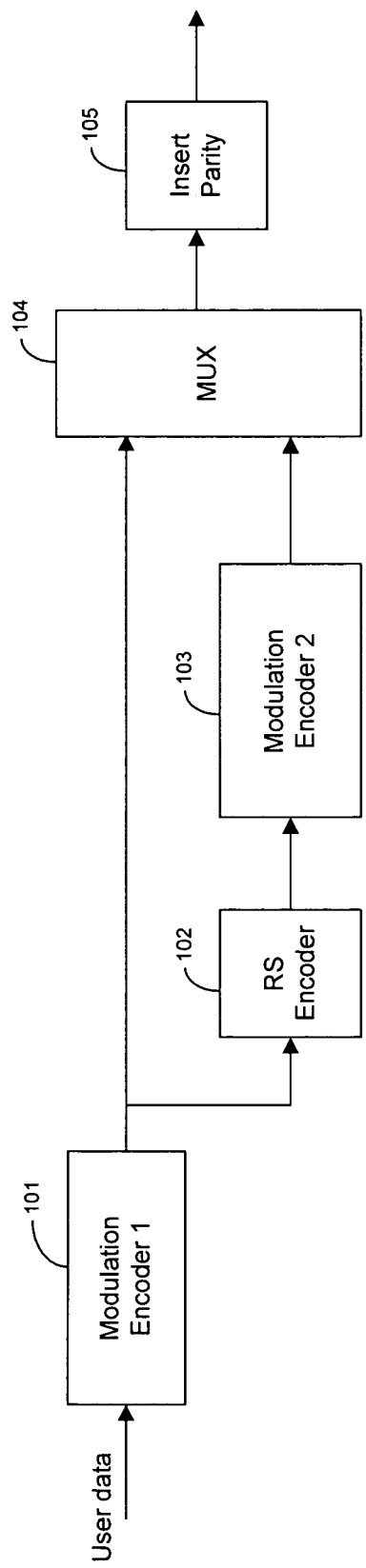
FIGS. 1A–1B illustrate two reverse concatenation schemes, in which modulation encoding techniques of the present invention can be incorporated.

FIG. 1A illustrates an example of an inner parity encoder cascaded with a conventional reverse concatenation scheme that inserts modulation codes into the data stream before and after generation of Reed-Solomon (RS) parity symbols. User data is first encoded by a first modulation encoder block 101. The first modulation encoder can be, for example, a very efficient MTR(j,k,t) encoder followed by a 1/(1+D) precoder. RS parity symbols are then generated by Reed-Solomon encoder 102 as a function of the MTR-encoded data stream.

The output stream of RS encoder 102 is encoded by a second modulation encoder block 103. The second modulation encoder can be, for example, an MTR(j,k,t) encoder with good error propagation properties followed by a 1/(1+D) precoder. Multiplexer 104 appends the output stream of block 103 to the modulation-encoded user data output of block 101. Parity insertion block 105 generates m inner parity bits as a function of n modulation-encoded bits and inserts them into the modulation-encoded data stream. The inner parity code rate of the output stream of block 105 is n/(n+m).

Figure 1B:
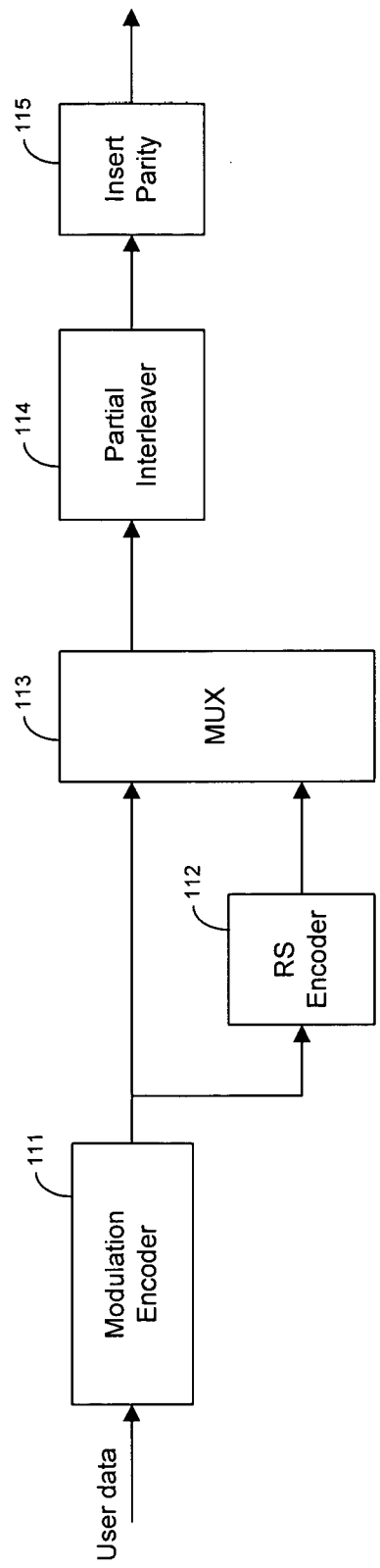

FIG. 1B illustrates an example of a reverse concatenation architecture that only inserts modulation codes into the data stream before the generation of Reed-Solomon (RS) parity symbols. User data is encoded by a modulation encoder in block 111. The modulation encoder can be, for example, a very efficient MTR(j,k,t) encoder followed by a 1/(1+D) precoder or a PRML(G,I) encoder followed by a $1/(1+D^2)$ precoder. Reed-Solomon encoder 112 generates RS parity symbols as a function of the encoded data stream. Multiplexer 113 appends the output stream of block 111 to the encoded data output of RS encoder 112.

Partial interleaver block 114 partially interleaves RS parity symbols into the constrained encoded symbol stream from block 111. Partial interleaving is described in further detail below with respect to FIGS. 5A–5B. The depth of partial interleaving of unconstrained RS parity symbols into the constrained symbol stream depends on the particular coding scheme and is selected to achieve the best possible constraints at the recording channel input. Parity insertion block 115 generates m inner parity bits as a function of n bits and inserts the inner parity bits into the encoded data stream. The inner parity code rate generated by block 115 is n/(n+m).

Examples of modulation encoding schemes of the present invention that can be performed by modulation encoders 101, 103, and 111 are now discussed with respect to FIGS. 2A–2B, 3A–3C, and 4. The embodiments of FIGS. 2A–2B will be described first.

Figure 2A:
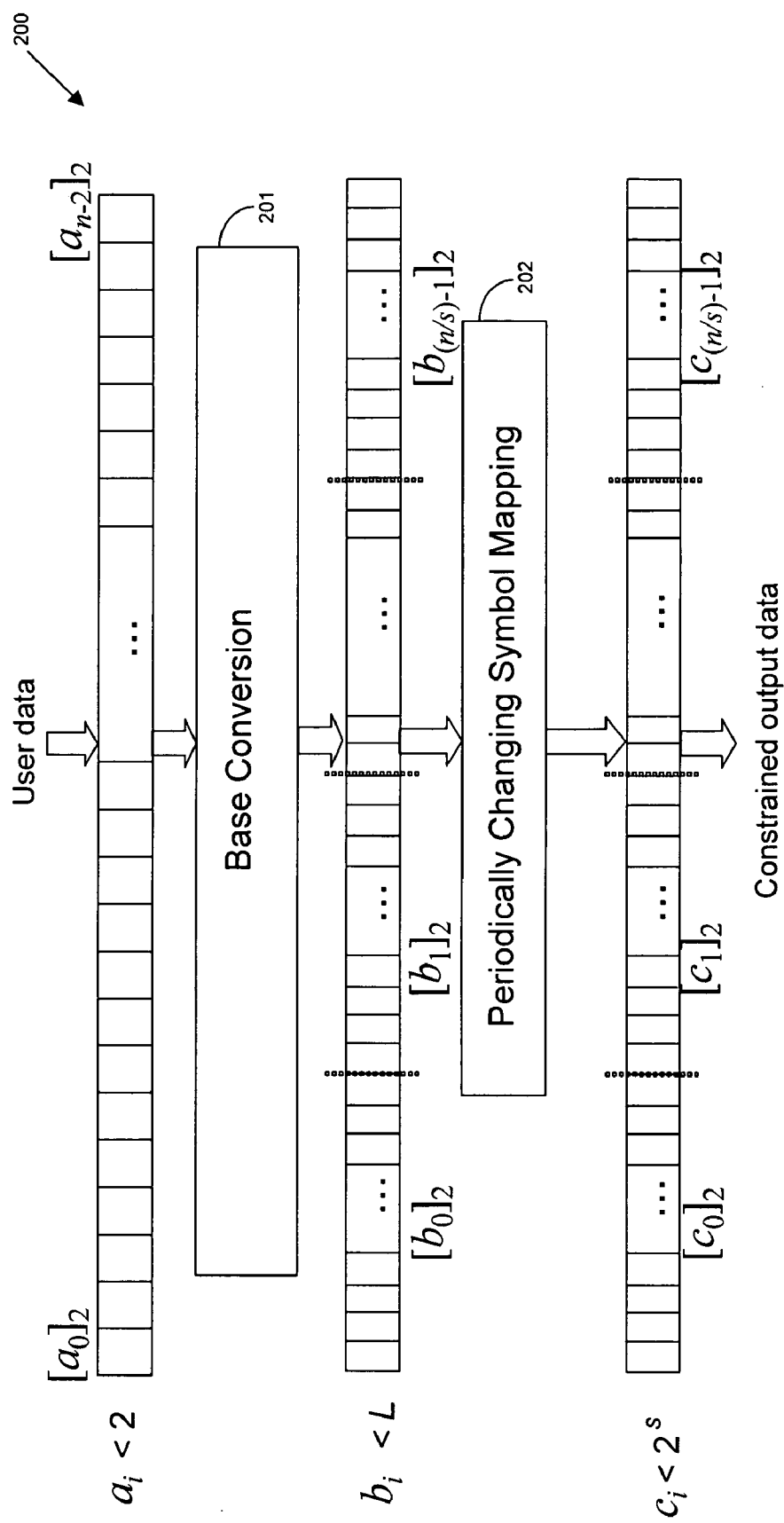
FIG. 2A illustrates a generalized technique for applying modulation constraints to data using base conversion and periodically changing symbol mappings, according to an embodiment of the present invention.

FIG. 2A illustrates a generalized scheme 200 for performing modulation encoding of data using periodically changing symbol mappings to achieve high code rates according to an embodiment of the present invention. Scheme 200 utilizes base conversion, followed by periodically changing symbol mappings.

At step 201, user data in the form of (n−1)-bit numbers $[a_i]$ at the input of the modulation encoder are converted from a first base into integers $[b_i]$ in a second base L using a base conversion technique. At step 202, periodically changing symbol mappings are performed to map the resulting symbols in the second base to constrained s-bit symbols $[c_i]$ using Boolean logic or lookup tables. The condition for the existence of a (n−1)/n rate code that belongs to this class is $2^{n-1} \leq L^{n/s}$, where 's' is the number of bits representing in each symbol of $[b_i]_2$.

Figure 2B:
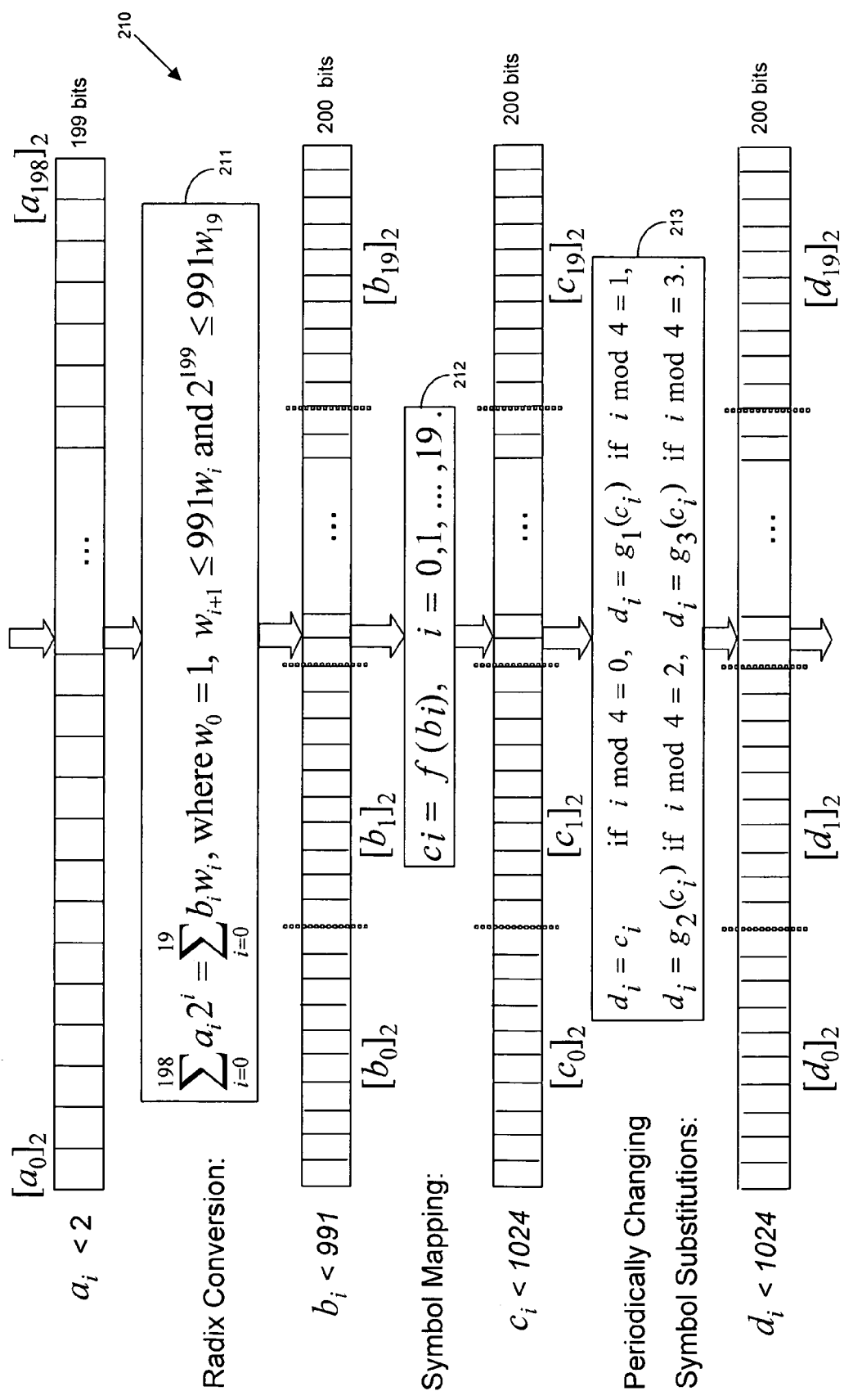
FIG. 2B illustrates a specific technique for applying modulation constraints to data using base conversion and periodically changing symbols mappings, according to an embodiment of the present invention.

FIG. 2B illustrates a specific example of the generalized modulation encoding embodiment of FIG. 2A. Modulation encoding technique 210 of FIG. 2B achieves high code rates by employing periodically-varying symbol substitutions with a period p following the step of symbol mapping. Modulating encoding technique 210 has a code rate of 199/200 bits.

The modulation encoder imposes a global constraint of G=26 and an interleaved constraint of I=22. In the absence of a precoder, these constraints are equivalent to limiting the maximum length of DC-patterns 00 . . . 0 and 11 . . . 1, and Nyquist patterns 0101 . . . and 1010 . . . to G+2 and the maximum number of consecutive like symbols in an even or odd interleave to I+1. These constraints can be abbreviated as PRML(G=26, I=22).

It should be understood the specific numbers used with respect to the particular parameters such as global G and interleaved I constraints, the base L, and the number of bits s in each symbol that are described with respect to FIG. 2B (and FIGS. 3B–3C and 4) are merely examples that are not intended to limit the scope of the present invention. One of skill in the art will understand that many other numbers can be used for these parameters, according to the techniques of the present invention.

Radix conversion is performed at step 211. An example of a radix conversion technique that can be used in radix conversion step 211 is described in U.S. Pat. No. 6,236,340, which is incorporated by reference herein. Radix conversion is merely one example of a base conversion technique that can be performed according to the present invention. The discussion of radix conversion herein is illustrative and is not intended to limit the scope of the present invention.

During the radix conversion step 211, 199-bit words of user data are mapped into integers in base 991. The 199-bit binary integers are represented in FIG. 2B by bits $[a_0]_2$ through $[a_{198}]_2$. The subscript 2 indicates binary, and the subscripts 0–198 are an index i identifying each bit. Radix conversion step 211 maps each 199-bit binary integer into an integer in base 991 that has 20 symbols. Each symbol in a base 991 integer has 991 possible values. The base 991 integer is represented in binary notation by symbols $[b_0]_2$ through $[b_{19}]_2$. The subscript 2 indicates binary notation, and the subscripts 0–19 are an index i identifying each symbol.

After radix conversion step 211, two periodically varying symbol mapping steps 212 and 213 are performed. Symbol mapping step 212 maps the base 991 integers $[b_i]_2$ generated by block 211 using a function f( ). An integer $[b_i]_2$ generated at step 211 has 20 symbols. Each symbol can be represented by 10 binary bits. Symbol mapping step 212 analyzes each 10-bit symbol in a $[b_i]_2$ integer.

Step 212 excludes 33 symbols that equal 0x0x0x0x0x or 1111111111 from the list of all possible symbols for $[b_i]$ in base 991, where x equals any binary value (1 or 0). Radix conversion step 211 can generate 991 possible symbols for each 991-base bit of a $[b_i]_{991}$ integer. A 10-bit binary number has 1024 possible values. Therefore, there are 991 possible symbols (1024−33=991) that remain for each of the 10-bit binary represented symbols of a $[b_i]_2$ integer.

If any of the 10-bit binary represented symbols of a $[b_i]_2$ integer match one of the prohibited symbols, it is replaced at step 212 with another 10-bit symbol that is not one of the 33 excluded symbols and that is not one of the 991 possible symbols that can be generated at radix step 211. Such a mapping is possible, because each 10-bit binary represented symbol has 1024 possible symbols, minus the 33 excluded symbols, which equals 991 possible symbols. The integers generated at step 212 are labeled $[c_0]_2$ through $[c_{19}]_2$ (the subscript 2 indicating a binary representation).

Thus, the range of the symbol mapping for the function performed at step 212 is a size-991 list of 10-bit symbols that is obtained by excluding 33 symbols of type 0x0x0x0x0x and 1111111111 from the list of all 10-bit symbols. The particular mapping of this function is preferably selected to minimize the complexity of the Boolean circuit implementing the function. Table 1 below lists the 33 symbols that are excluded in all of the four phases 0–3. Table 1, column 2 lists the symbols that are excluded at symbol mapping step 212 during phase 0 (i.e., i mod 4=0).

TABLE 1

| | Phase 0 (i mod 4 = 0) | Phase 1 (i mod 4 = 1) | Phase 2 (i mod 4 = 2) | Phase 3 (i mod 4 = 3) |
|---|---|---|---|---|
| Excluded 33 symbols $[d_i]_2$ | 0x0x0x0x0x 1111111111 | 1x1x1x1x1x 0000000000 | x0x0x0x0x0 1111111111 | x1x1x1x1x1 0000000000 |

Step 213 performs periodically changing symbol substitutions on the integers $[c_i]$ generated at step 212. Step 213 performs symbol substitutions that vary in time during phases 1–3, depending on which symbol of $[c_i]_2$ is being considered.

Phase 0 occurs when the index i of a symbol of $[c_i]_2$ is evenly divisible by 4 (i.e., i mod 4=0). During phase 0, the excluded symbols are replaced at step 212, as described above. No action is taken in phase 0 during step 213 when the index of a $[c_i]$ symbol is 0, 4, 8, 12, 16, 24, etc. The symbols generated at step 213 are labeled $[d_0]_2$ through $[d_{19}]_2$.

Symbol substitutions are performed at step 213 for the $[c_i]_2$ symbols during phases 1, 2, and 3. The substitutions performed at step 213 during phases 1–3 are summarized in Table 2 below. Note that x in Table 2 stands for ($x_1$, $x_2$, $x_3$, $x_4$, $x_5$), and ~ stands for the Boolean negation. All the substitutions in phases 1–3 are relative to the list of allowed symbols in phase 0. Therefore, no substitution is performed in phase 0. No preceding operation is required for this particular embodiment. The periodically-varying symbol substitutions performed by step 213 are characterized by three mappings, g1(.), g2(.) and g3(.).

TABLE 2

| | Phase 1 (i mod 4 = 1) | Phase 2 (i mod 4 = 2) | Phase 3 (i mod 4 = 3) |
|---|---|---|---|
| Prohibited symbols $[c_i]_2$ | $1x_1 1x_2 1x_3 1x_4 1x_5$ where $x \neq$ (1, 1, 1, 1, 1) | $x_1 0x_2 0x_3 0x_4 0x_5 0$ where $x \neq$ (0, 0, 0, 0, 0) | $x_1 1x_2 1x_3 1x_4 1x_5 1$ where $x \neq$ (0, 0, 0, 0, 0) and $x \neq$ (1, 1, 1, 1, 1) |
| Substitute Symbols $[d_i]_2$ | $0(\sim x_1)0(\sim x_2)$-$0(\sim x_3)0(\sim x_4)$-$0(\sim x_5)$ where $x \neq$ (1, 1, 1, 1, 1) | $0x_1 0x_2 0x_3 0x_4 0x_5$ where $x \neq$ (0, 0, 0, 0, 0) | $0x_1 0x_2 0x_3 0x_4 0x_5$ where $x \neq$ (0, 0, 0, 0, 0) and $x \neq$ (1, 1, 1, 1, 1) |

Phase 1 occurs each time the index i of a $[c_i]$ symbol has a remainder of 1 when divided by 4 (i.e., i mod 4=1). For example, phase 1 occurs when the indexes of a $[c_i]$ symbol are 1, 5, 9, 13, 17, 25, etc. During phase 1, the symbols shown in the second row, second column of Table 2 are replaced with the symbols shown in the third row, second column of Table 2. The substitute symbols are in the set of symbols (0x0x0x0x0x) excluded during phase 0 in step 212.

Phase 2 occurs each time the index i of a $[c_i]$ symbol has a remainder of 2 when divided by 4 (i.e., i mod 4=2). For example, phase 2 occurs when the indexes of a $[c_i]$ symbol are 2, 6, 10, 14, 18, 26, etc. During phase 2, the symbols shown in the second row, third column of Table 2 are replaced with the symbols shown in the third row, third column of Table 2. The substitute symbols are in the set of symbols (0x0x0x0x0x) excluded during phase 0 in step 212.

Phase 3 occurs each time the index i of a 10-bit block of a $[c_i]$ symbol has a remainder of 3 when divided by 4 (i.e., i mod 4=3). For example, phase 3 occurs when the indexes of a $[c_i]$ symbol are 3, 7, 11, 15, 18, 27, etc. During phase 3, the symbols shown in the second row, fourth column of Table 2 are replaced with the symbols shown in the third row, fourth column of Table 2. The substitute symbols are in the set of symbols (0x0x0x0x0x) excluded during phase 0 in step 212.

The modulation encoding technique of FIG. 2B has parameters of n=200, L=991 and s=10. These specific parameters are referred to as Code 1. The variable n refers to the number of bits in a code word block. The variable L refers to the base of the integers $[b_i]$ generated by radix conversion step 211. The variable s refers to the number of bits in each symbol of $[b_i]_2$, $[c_i]_2$ and $[d_i]_2$.

The codes in this family have a symbol alphabet of size $L=2^{s/2}(2^{s/2}-1)-1$ and satisfy the constraints G=3s−4 and I=5(s/2)−3, where s is assumed to be even, and the code word size, n bits, is divisible by 4s. Although a precoder is not used for this class of codes, the constraints are still characterized by equivalent global G and interleaved I constraint values. In other words, the maximum length of DC- and Nyquist patterns at the recording channel input is G+2, and the maximum length of DC-patterns in an odd or even interleave of the recording channel input is I+1. Encoder 200 can also be used to construct an encoder that has a rate of 209/210 PRML(26,22) code with parameters n=210, L=991 and s=10 code, although 210 is not divisible by 40. In this case, the first symbol of a code word j occurs in phase (i mod 4), whereas in FIG. 2B the first symbol of each code word occurs always in phase 0.

Figure 3A:
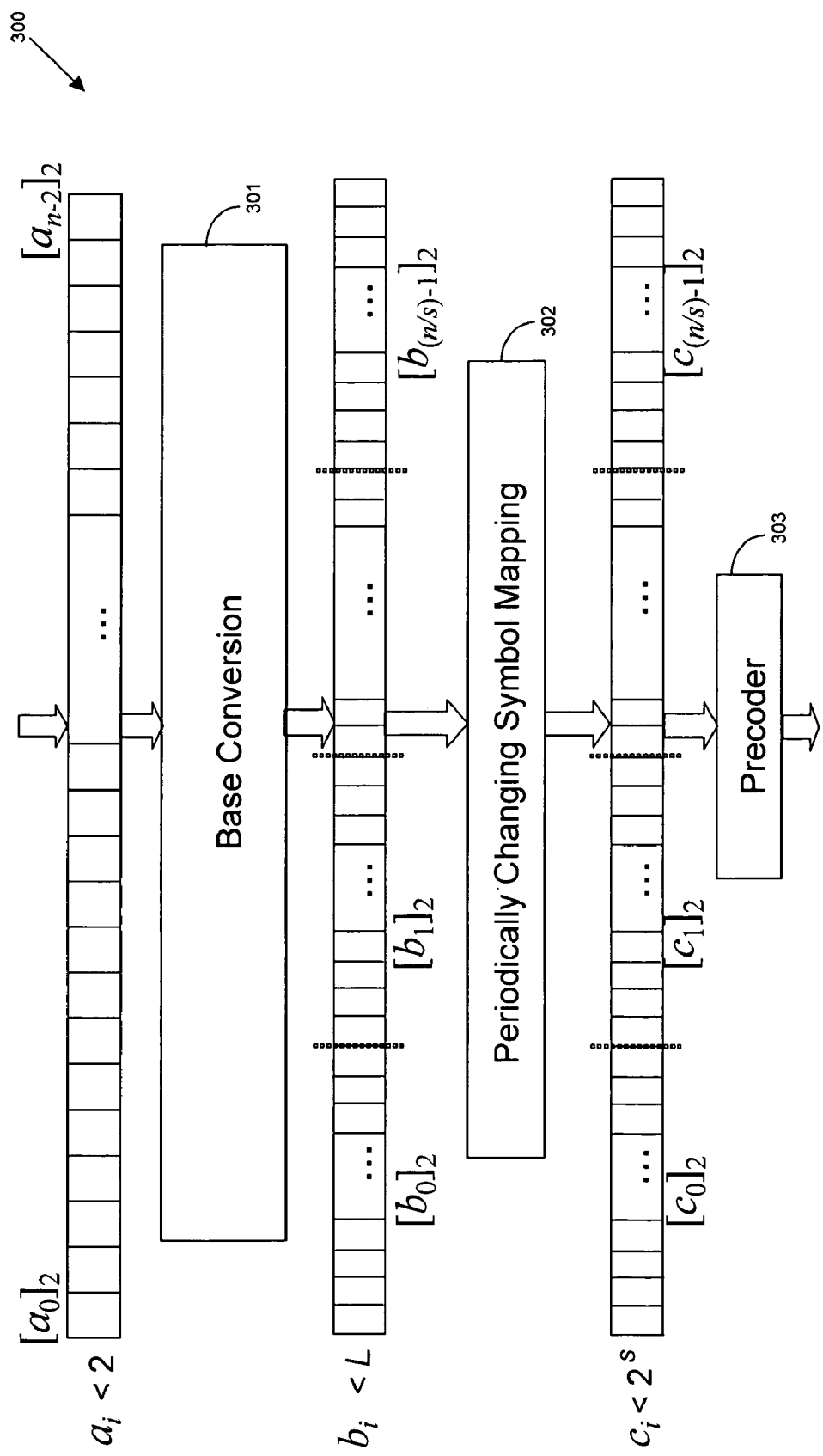
FIGS. 3A illustrates another generalized technique for applying modulation constraints to data using base conversion, periodically changing symbol mappings, and precoding, according to an embodiment of the present invention.

FIG. 3A illustrates a generalized scheme 300 for performing modulation encoding of data using periodically changing symbol mappings to achieve high code rates according to further embodiments of the present invention. Encoder 300 utilizes base conversion, followed by periodically changing symbol mappings, and precoding.

At step 301, a base conversion technique is performed to convert user data in a first base into integers into a second base L representation [$b_i$]. At step 302, periodically changing symbol mappings are performed to map the resulting base L symbols into constrained s-bit symbols [$c_i$] using Boolean logic or lookup tables.

Precoder 303 then encodes the resulting constrained symbols after step 302. The precoding step removes prohibited symbols x1x1x1x1x1 and 1x1x1x1x1x. As a result, only two phases of symbol mappings are performed at step 302 to remove prohibited symbols 0x0x0x0x0x and x0x0x0x0x0.

Figure 3B:
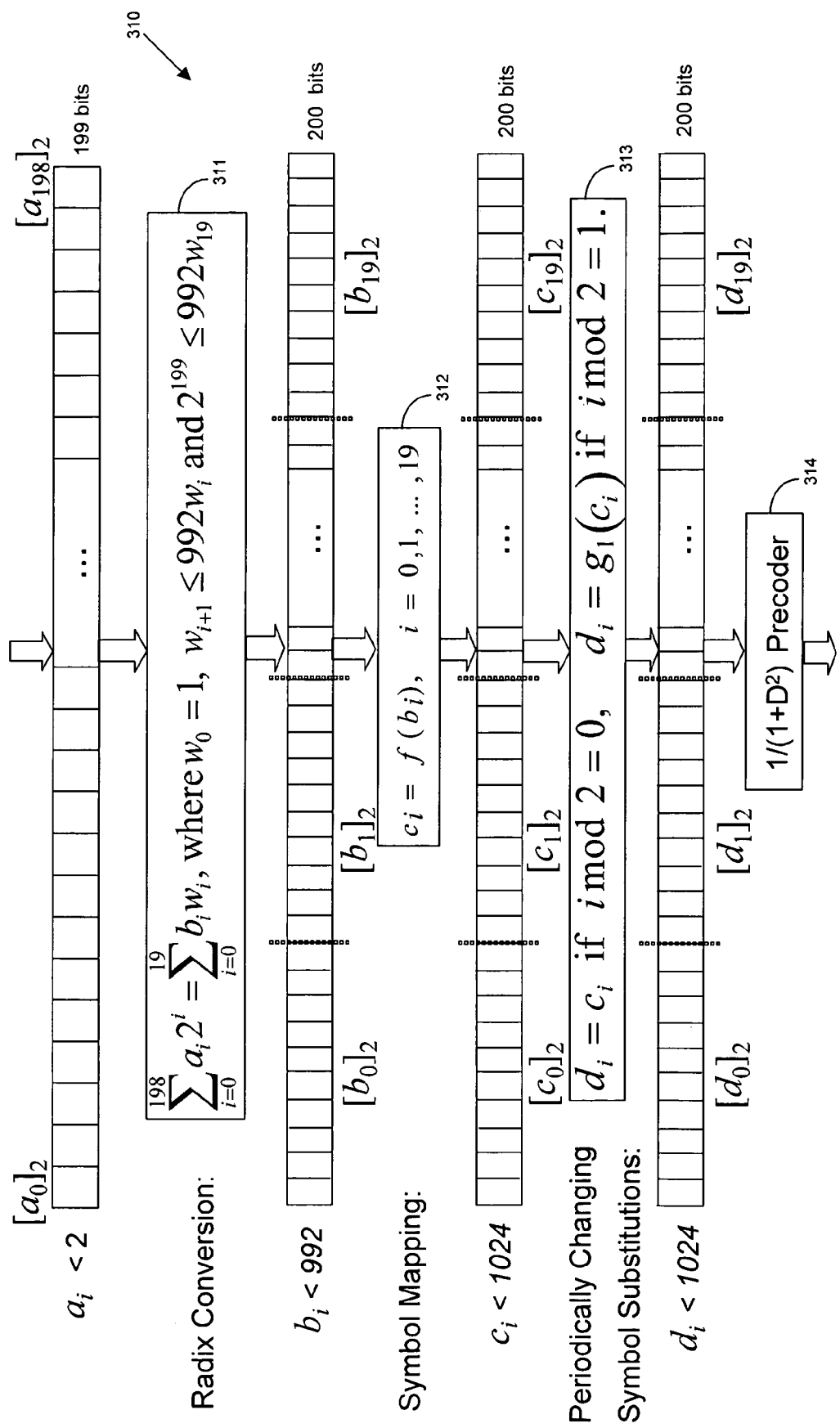
FIGS. 3B–3C illustrate two specific techniques for applying modulation constraints to data using base conversion, periodically changing symbol mappings, and preceding, according to embodiments of the present invention.

FIG. 3B illustrates a specific example of the generalized modulation encoding embodiment of FIG. 3A. Modulating encoder 310 has a code rate of 199/200 bits, and generates PRML(G=18, I=13) code with parameters n=200, L=992 and s=10. These parameters are referred to as Code 2.

Radix conversion step 311 of modulation encoder 310 uses a radix base-992 conversion of a 199-bit word at the encoder input. Step 312 performs symbol mappings of the [$b_i$] symbols generated at step 311. Step 313 performs periodically varying symbol substitutions on the [$c_i$] symbols generated at step 312. Step 314 performs $1/(1+D^2)$ precoding on the [$d_i$] symbols generated at step 313.

Table 3 below lists the 32 symbols that are excluded in each of the two phases of encoder 310. The 2 phases are represented by the equation i mod 2. Symbol mapping step 312 performs a range of symbol mapping f(.) that is a size-992 list of 10-bit symbols obtained by excluding 32 symbols of type 0x0x0x0x0x from the list of all 1024 possible 10-bit symbols. If any of the 10-bit symbols of [$b_i$]$_2$ equals 0x0x0x0x0x, these symbols are mapped to another 10-bit symbol that does not equal 0x0x0x0x0x.

A 10-bit binary number has 1024 possible symbols. If 32 excluded symbols are subtracted from the 1024 possible symbols, 992 possible symbols remain. Each [$b_i$]$_{992}$ has 992 possible symbols. Therefore, there are enough symbols remaining to map each symbol that violates the constraint 0x0x0x0x0x to a symbol that does not violate this constraint and that is not generated in the radix conversion step. The particular mapping f(.) is preferably selected to minimize the complexity of the Boolean circuit implementing f(.). As can be seen from Table 3, symbol mapping step 312 imposes constraints in phase 0 (i.e., i mod 2=0).

TABLE 3

|  | Phase 0 (i mod 2 = 0) | Phase 1 (i mod 2 = 1) |
|---|---|---|
| Excluded 32 symbols [$d_i$]$_2$ | 0x0x0x0x0x | x0x0x0x0x0 |

Step 313 imposes periodically-varying symbol substitutions during phase 1. Table 4 below illustrates the symbols that are prohibited by step 313 and the symbols that are substituted for the prohibited symbols. The symbol substitutions shown in Table 4 are performed where prohibited symbols [$c_i$]$_2$ in phase 1 are replaced by substitute symbols [$d_i$]$_2$. The periodically-varying symbol substitutions are characterized by the mapping g1(.). Note that x in Table 4 stands for ($x_i$, $x_2$, $x_3$, $x_4$, $x_5$) and ~ stands for the Boolean negation.

TABLE 4

|  | Phase 1 (i mod 2 = 1) |
|---|---|
| Prohibited Symbols [$c_i$]$_2$ | $x_1 0 x_2 0 x_3 0 x_4 0 x_5 0$ where $x \ne (0, 0, 0, 0, 0)$ |
| Substitute Symbols [$d_i$]$_2$ | $0 x_1 0 x_2 0 x_3 0 x_4 0 x_5$ where $x \ne (0, 0, 0, 0, 0)$ |

All the substitutions in phase 1 are relative to the list of allowed symbols in phase 0, and therefore no substitution is performed in phase 0. The substitute symbols in phase 1 are in the set of symbols (0x0x0x0x0x) that were excluded in phase 0 at step 312.

The maximum possible rate for this class of codes with s=10 is 209/210 because $2^{209} \le 992^{21}$ and $2^{219} > 992^{22}$. The codes in this family have a symbol alphabet of size $L=2^{s/2}$ ($2^{s/2}-1$) and satisfy the constraints G=2(s-1) and I=3(s/2)-2, where we assume that s is even and the code word size, n bits, is divisible by 2s. Although 210 is not divisible by 20, a modulation encoder of type shown in FIG. 3A with a rate-209/210 PRML(G=18, I=13) code with parameters n=210, L=992 and s=10 code can also be constructed. In this case, the first symbol of a code word j occurs in phase (j mod 2), whereas in FIG. 3B the first symbol of each code word occurs always in phase 0.

Figure 3C:
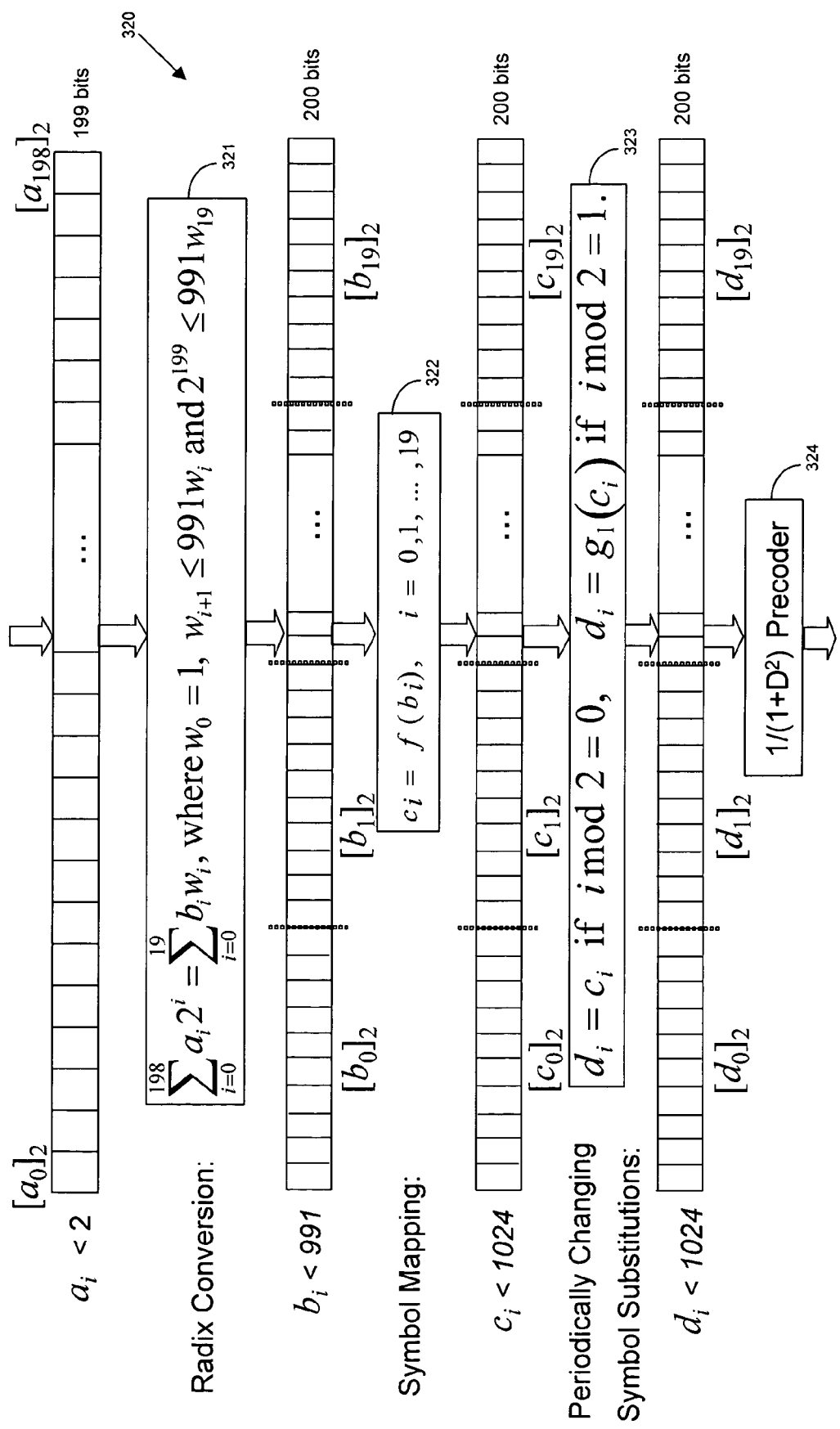

As another example of the present invention, a rate-199/200 PRML(G=16, I=13) code with parameters n=200, L=991 and s=10 can be obtained, if the symbol 1000000000 in phase 0 and the symbol 0000000001 in phase 1 are excluded, in addition to the other excluded symbols. This code is referred to as Code 3. A modulation encoder 320 for Code 3 is shown in FIG. 3C. Radix conversion step 321 in FIG. 3C performs radix conversion of 199-bit blocks of input data into base 991 integers. Each base 991 integer is expressed as binary symbols [$b_i$]$_2$. Symbol mapping step 322 and symbol substitution step 323 replace prohibited symbols during two phases. Table 5 below lists the 33 symbols [$d_i$]$_2$ that are excluded in each of the two phases of i mod 2.

TABLE 5

|  | Phase 0 (i mod 2 = 0) | Phase 1 (i mod 2 = 1) |
|---|---|---|
| Excluded 33 symbols [$d_i$]$_2$ | 0x0x0x0x0x 1000000000 | x0x0x0x0x0 0000000001 |

The range of the symbol mapping f(.) performed at step 322 is a size-991 list of 10-bit symbols that is obtained by excluding 33 symbols of type 0x0x0x0x0x and 1000000000 from the list of all 10-bit symbols. The particular mapping f(.) is preferably selected to minimize the complexity of the Boolean circuit implementing f(.). As it can be seen from Table 5, step 322 imposes constraints that are desired in phase 0 (i.e., i mod 2=0).

In order to impose the desired constraints in phase 1, the periodically-varying symbol substitutions are performed in step 323. The periodically-varying symbol substitutions performed at step 323 are shown in Table 6 below. Note that x in Table 6 stands for ($x_1,x_2,x_3,x_4,x_5$) and ~ stands for the Boolean negation. The symbol substitutions performed at step 323 are characterized by the mapping $g_1$(.) in FIG. 3C.

TABLE 6

|  | Phase 1 (i mod 2 = 1) |
| --- | --- |
| Prohibited Symbols $[c_i]_2$ | 0000000001 $x_10x_20x_30x_40x_50$ where $x \neq (0, 0, 0, 0, 0)$ |
| Substitute Symbols $[d_i]_2$ | 1000000000 $x_10x_20x_30x_40x_50$ where $x \neq (0, 0, 0, 0, 0)$ |

All the substitutions in phase 1 are relative to the list of allowed symbols in phase 0, and therefore no substitution is performed in phase 0 at step 323. The maximum rate for this class of codes with s=10 is 209/210, because $2^{209} \leq 991^{21}$ and $2^{219} > 991^{22}$. The codes in this family have a symbol alphabet of size $L=2^{s/2}(2^{s/2}-1)-1$ and satisfy the constraints G=2(s-1)-2 and I=3(s/2)-2, where s is assumed to be even, and the code word size, n bits, is divisible by 2s. A rate-209/210 PRML(16,13) code with parameters n=210, L=991 and s=10 code can also be constructed, although 210 is not divisible by 20. In this case, the first symbol of a code word j occurs in phase (j mod 2), whereas in FIG. 3C the first symbol of each code word occurs always in phase 0.

Unbalanced interleaved codes are a subclass of codes with fixed-size, periodically-varying symbol alphabets and can be implemented by simple encoding/decoding structures based on interleaving unconstrained input data with constrained data. The codes in this class have a symbol alphabet of size $L=2^{s/2}(2^{s/2}-1)$ and satisfy the constraints G=2(s-1) and I=3(s/2)-2, where s is assumed to be even, and the code word size, n bits, is divisible by 2s.

Figure 4:
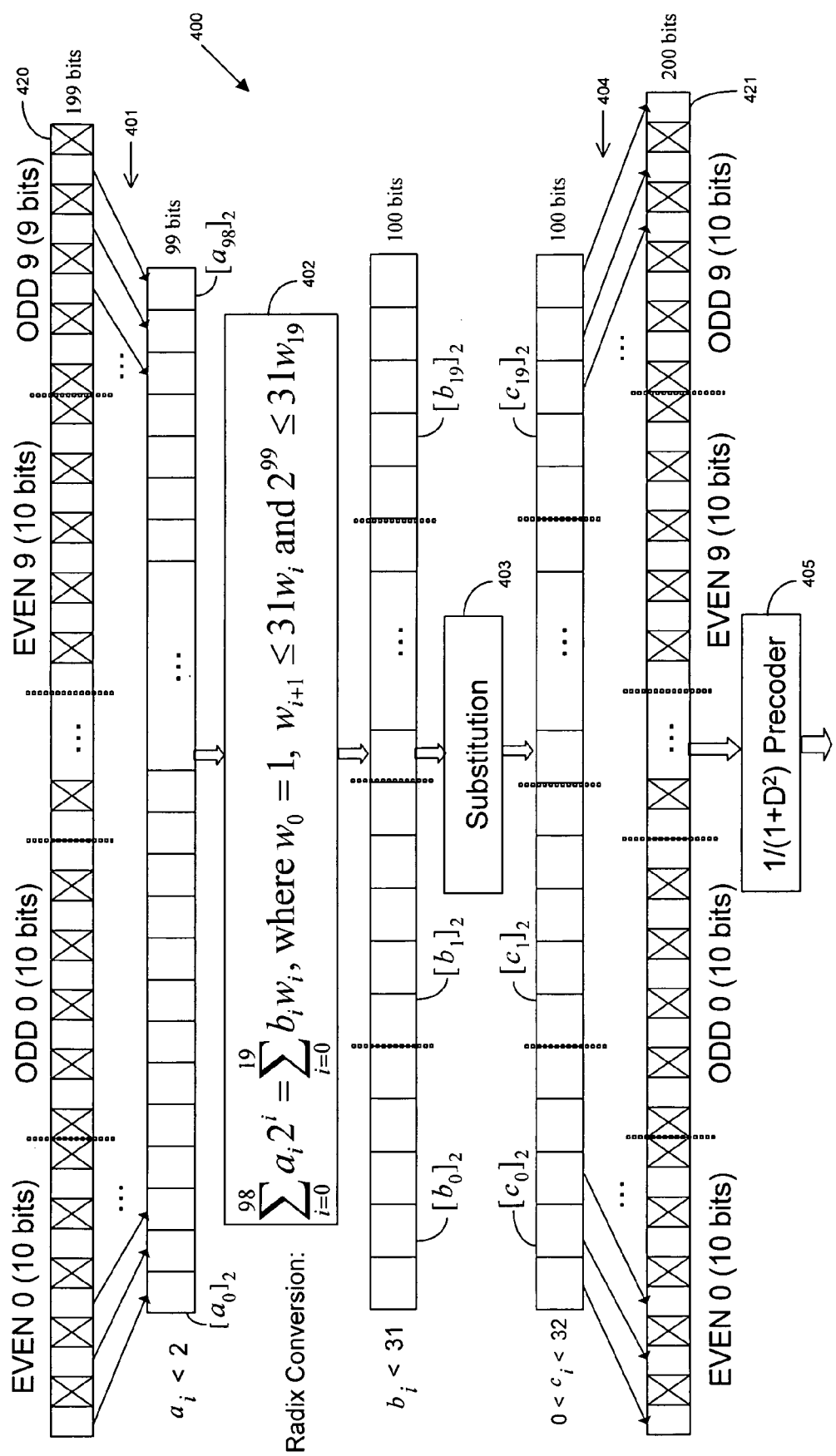
FIG. 4 illustrates a technique for applying modulation constraints to data using base conversion, symbol substitution on even and odd interleaves, and precoding, according to an embodiment of the present invention.

FIG. 4 shows the simplified rate-199/200 modulation encoder 400, which is now viewed as an unbalanced interleaved code. Modulation encoder 400 is an alternative encoding structure for Code 2. For Code 2 with s=10, the values for the following parameters apply, L=992, G=18 and I=13. Modulation encoder 400 can also be applied to other codes.

Referring to FIG. 4, 199-bit input words 420 are demultiplexed in a specific manner at step 401. The demultiplexing is performed by extracting even-numbered bits from even-numbered symbols and extracting odd-numbered bits from odd-numbered symbols to generate a 99-bit word $[a_i]$. Five even bits are extracted from 10 even-numbered symbols, 5 odd bits are extracted from the first 9 odd-numbered symbols, and 4 bits are extracted from the $10^{th}$ odd-numbered symbol to generate the 99 bits of $[a_i]$. The 99 extracted bits of $[a_i]$ are shown as the empty boxes in word 420 without X's in them. The remaining 100 bits of word 420, shown as boxes with X's in them, are removed from the original 199 bit word and then recombined at step 404 as described below.

The first symbol in a word of user data is usually considered as the $0^{th}$ symbol, and therefore is an even numbered symbol. The next symbol odd, the symbol after that even, and so on. The first bit in a symbol however is usually considered to be the $0^{th}$ bit, and therefore is an even bit. The second bit in a symbol is odd, the bit after that even, and so on.

The 99-bit word $[a_i]$ is encoded into a 100-bit word (of constrained data) at radix conversion step 402. At step 402, the 99-bit number at the input of the encoder $[a_i]$ is converted into a radix 31 integer representation $[b_i]$. The i index (0–98) in the $[a_i]$ integer corresponds to 99 bits of $[a_i]$. The index i (0–19) in the $[b_i]$ integer corresponds to twenty symbols of $[b_i]$. Each of the symbols of $[b_i]$ can be represented by 5 bits.

At step 403, a substitution operation replaces prohibited patterns in $[b_i]$. The substitution operation 403 replaces bit patterns 00000 ($b_i$=0) with substitute patterns 11111 ($c_i$=31) to generate a constrained integer having 20 symbols $[c_i]$, each symbol being represented by 5 binary bits. Because the even numbered bits are extracted from the even numbered symbols and the odd numbered bits are extracted from the odd numbered symbols at step 401, substitution step 403 is able to eliminate all of the prohibited symbols (x0x0x0x0x0 and 0x0x0x0x0x) in the input data, without performing the multiple phase substitutions used in previous embodiments.

After the substitution step 403, the constrained symbols $[c_i]$ and the unconstrained 100 bits from word 420 are multiplexed together at step 404 to generate a 200 bit word 421 as shown in FIG. 4. The combined 200 bit word is then processed by a $1/(1+D^2)$ precoder at step 405.

According to another embodiment of the present invention, a simple and efficient algorithm based on Homer's rule can be used to implement radix conversion between $2^{s/2}$ base number representation and $(2^{s/2}-1)$ base number representation. A radix conversion algorithm that is based on matrix multiplication is discussed in U.S. Pat. No. 6,236,340.

For s=10, the algorithm on the encoder side for Code 2 is based on evaluating the 99-bit integer number at the input of the radix conversion engine using 19 successive multiply-and-adds in base 31 arithmetic. Because multiplication by 32=31+1 in base 31 arithmetic is equivalent to shift-and-add, only 19 additions in base 31 arithmetic are needed to obtain twenty 5-bit base 31 numbers, according to equation (1).

$$x = \sum_{j=0}^{19} x_j 32^j = (( \ldots (x_{19}32 + x_{18})32 + \ldots )32 + x_1)32 + x_0 \sum_{j=0}^{19} b_j 31^j \quad (1)$$

The radix conversion algorithm in the encoder can be implemented by 2+3+4+ . . . +20=209 successive 5-bit full adders with two 5-bit addends and 1-bit carry at its input, one 5-bit 31-base number and 1-bit carry at its output. The computational unit for 5-bit additions can be implemented using Boolean logic, where 11 bits are mapped into 6 bits and the logic circuit is optimized in terms of latency. Furthermore, two or more additions can be lumped together and further optimized for delay and gate count. For example, two 5-bit additions can be performed by a Boolean circuit mapping 21 bits into 11 bits.

The algorithm on the decoder side is based on evaluating the 100-bit integer number at the input of the radix conversion engine using 19 successive multiply-and-subtracts in base 32 arithmetic. Because multiplication by 31=32-1 in base 32 arithmetic is equivalent to shift-and-subtract, only 19 subtractions need to be performed in base 32 arithmetic to obtain 20 5-bit base 32 numbers, as shown in equation (2).

$$x = \sum_{j=0}^{19} b_j 31^j = (( \ldots (b_{19}31 + b_{18})31 + \ldots )31 + b_1)31 + b_0 \sum_{j=0}^{19} x_j 32^j \quad (2)$$

The radix conversion algorithm in the decoder can be implemented by 2+3+4+ . . . +20=209 successive 5-bit subtractions.

The constraints of the three families of PRML(G,I) codes previously discussed were characterized at the input of the Reed-Solomon (RS) encoder. The code parameters for these codes are summarized below in Table 7. As discussed above, L represents the base of the number generated at the radix conversion step, p is the number of phases, G is the global constraint, I is the interleaved constraint, and s is the number of binary bits in each symbol.

TABLE 7

|   | Code 1 | Code 2 | Code 3 |
|---|---|---|---|
| L | $2^{s/2}(2^{s/2}-1)-1$ | $2^{s/2}(2^{s/2}-1)-1$ | $2^{s/2}(2^{s/2}-1)-1$ |
| P | 4 | 2 | 2 |
| G | $3s-4$ | $2(s-1)$ | $2(s-2)$ |
| I | $5(s/2)-3$ | $3(s/2)-2$ | $3(s/2)-2$ |

From an overall-system viewpoint, the constraints at the input of a recording channel are important. In other words, the maximum length of DC- and Nyquist patterns at the recording channel input, and the maximum length of DC- patterns in an odd or even interleave of the recording channel need to be computed. These parameters can be determined by studying the modulation properties of the sequences at the output of the partial symbol interleaver 114 shown in FIG. 1B.

The depth of partial symbol interleaving should be chosen such that the modulation constraints at the recording channel input are as tight as possible. One way that modulation constraints at the recording channel input can be tightened is by interspersing unconstrained RS parity symbols in between constrained RS data symbols, so that no 2 RS parity symbols are next to each other. Examples of this technique are described below with respect to FIGS. 5A and 5B.

FIG. 5A shows a depth-5 partial symbol interleaving scheme that has been selected for Code 1, where n refers to the length (in symbols) of the RS code words. FIG. 5A illustrates a code word generated by the RS encoder 112 and a code word generated by partial symbol interleaver 114. The bits that have unshaded boxes below them are the Reed-Solomon (RS) data symbols, and the bits that have shaded boxes below them are the RS parity symbols. As shown in FIG. 5A, partial symbol interleaver 114 intersperses the RS parity symbols in between the RS data symbols. Each RS parity symbol is separated from another RS parity symbol by 4 RS data symbols. For example, RS parity symbols n and n–5 are separated by 4 RS data symbols.

FIG. 5B shows a depth-4 partial symbol interleaving scheme that has been selected for Code 2 and Code 3. FIG. 5B illustrates a code word generated by the RS encoder 112 and a code word generated by partial symbol interleaver 114. The bits that have unshaded boxes below them are the Reed-Solomon (RS) data symbols, and the bits that have shaded boxes below them are the RS parity symbols. As shown in FIG. 5B, partial symbol interleaver 114 intersperses the RS parity symbols in between the RS data symbols. Each RS parity symbol is separated from another RS parity symbol by 3 RS data symbols. For example, RS parity symbols n and n–4 are separated by 3 RS data symbols.

Table 8 below summarizes the modulation constraints following partial symbol interleaving and inner parity bit insertion for Code 1, Code 2, and Code 3, where the inner parity code is assumed to be a rate-100/102 code.

TABLE 8

|   | Code 1 | Code 2 | Code 3 |
|---|---|---|---|
| (G, I) | (38, 28) | (30, 19) | (28, 19) |

While the present invention has been described herein with reference to particular embodiments thereof, a latitude of modification, various changes, and substitutions are intended in the present invention. In some instances, features of the invention can be employed without a corresponding use of other features, without departing from the scope of the invention as set forth. Therefore, many modifications may be made to adapt a particular configuration or method disclosed, without departing from the essential scope and spirit of the present invention. It is intended that the invention not be limited to the particular embodiment disclosed, but that the invention will include all embodiments and equivalents falling within the scope of the claims.

What is claimed is:

1. A method for imposing modulation constraints on data, the method comprising:
    converting a word of data from a first base into an integer in a second base using a base conversion technique, wherein the integer comprises a plurality of symbols; and
    performing periodically varying symbol mappings of symbols in the integer that match excluded symbols.

2. The method defined in claim 1 wherein converting the word of data from the first base into the second base using the base conversion technique further comprises:
    performing radix conversion to convert the word of data from the first base into the second base.

3. The method defined in claim 1 wherein performing the periodically varying symbol mappings further comprises:
    if one of the symbols in the integer matches a first prohibited symbol during a first phase, substituting that symbol with a first substitute symbol.

4. The method defined in claim 3 wherein performing the periodically varying symbol mappings further comprises:
    if one of the symbols in the integer matches a second prohibited symbol during a second phase, substituting that symbol with a second substitute symbol.

5. The method defined in claim 4 wherein performing the periodically varying symbol mappings further comprises:
    if one of the symbols in the integer matches a third prohibited symbol during a third phase, substituting that symbol with a third substitute symbol.

6. The method defined in claim 1 further comprising:
    precoding the integer using a $1/(1+D^2)$ precoder.

7. The method defined in claim 1 wherein the method for imposing the modulation constraints on the data is performed in a reverse concatenation scheme.

8. The method defined in claim 7 further comprising:
    generating Reed-Solomon (RS) parity symbols using an RS encoder; and
    interspersing the RS parity symbols in between sets of the symbols of the integer such that each RS parity symbol is separated by at least 4 of the integer symbols.

9. The method defined in claim 7 further comprising:
    generating Reed-Solomon (RS) parity symbols using an RS encoder; and
    interspersing the RS parity symbols in between sets of the symbols of the integer such that each RS parity symbol is separated by at least 3 of the integer symbols.

10. A method for imposing modulation constraints on data, the method comprising:
- extracting even-numbered bits from even-numbered symbols and odd-numbered bits from odd-numbered symbols in a data word to generate a data block;
- converting the data block from a first base into a first integer in a second base using a base conversion technique;
- substituting symbols in the first integer that match prohibited symbols with substitute symbols to generate a second integer; and
- interleaving bits in the second integer with odd-numbered bits from the even-numbered symbols and even-numbered bits from the odd-numbered symbols in the data word.

11. The method according to claim 10 further comprising: precoding the integer using a $1/(1+D^2)$ precoder.

12. The method according to claim 10 wherein converting the data block from the first base into the first integer in the second base using the base conversion technique further comprises:
- performing radix conversion to convert the first integer from the first base into the second base.

13. The method according to claim 10 wherein substituting the symbols in the first integer that match prohibited symbols with substitute symbols to generate the second integer further comprises:
- substituting symbols in the first integer that have s/2 consecutive zeros with symbols that have s/2 consecutive ones, where s is the number of bits in each symbol of the data word.

14. A disk drive system comprising:
- a disk driver controller chipset that includes a modulation encoder,
- wherein the modulation encoder converts data words from a first base into integers in a second base using a base conversion technique, and performs periodically varying symbol mappings of symbols in the integers that match excluded symbols.

15. The disk drive system defined in claim 14 wherein the disk drive controller chipset further comprises a $1/(1+D^2)$ precoder.

16. The disk drive system defined in claim 14 wherein the disk drive controller chipset further comprises a Reed-Solomon error correction encoder that is coupled to an output of the modulation encoder and that generates parity symbols, and a multiplexer that intersperses the parity symbols in between sets of the symbols of the integers such that each parity symbol is separated by at least 3 of the integer symbols.

17. The disk drive system defined in claim 16 wherein each parity symbol is separated by at least 4 of the integer symbols.

18. The disk drive system defined in claim 14 wherein the modulation encoder performs radix conversion to convert the data words from the first base into the second base.

19. The disk drive system defined in claim 14 wherein the modulation encoder substitutes symbols in the integer that match a first prohibited symbol during a first phase with a first substitute symbol.

20. The disk drive system defined in claim 15 wherein the modulation encoder substitutes symbols in the integer that match a second prohibited symbol during a second phase with a second substitute symbol.

21. The disk drive system defined in claim 16 wherein the modulation encoder substitutes symbols in the integer that match a third prohibited symbol during a third phase with a third substitute symbol.

22. A disk drive system comprising:
- a disk drive controller chipset that includes a modulation encoder,
- wherein the modulation encoder extracts even-numbered bits from even-numbered symbols and odd-numbered bits from odd-numbered symbols in a data word to generate a data block,
- wherein the modulation encoder converts the data block from a first base into a first integer in a second base using a base conversion technique,
- wherein the modulation encoder substitutes symbols in the first integer that match prohibited symbols with substitute symbols to generate a second integer, and
- wherein the modulation encoder interleaves bits in the second integer with odd-numbered bits from the even-numbered symbols and even-numbered bits from the odd-numbered symbols in the data word to generate a constrained data word.

23. The disk drive system defined in claim 22 wherein the disk drive controller chipset further comprises a $1/(1+D^2)$ precoder.

24. The disk drive system defined in claim 22 wherein the disk drive controller chipset further comprises a Reed-Solomon error correction encoder that is coupled to an output of the modulation encoder and that generates parity symbols, and a multiplexer that intersperses the parity symbols in between sets of the symbols of the integers such that each parity symbol is separated by at least 3 of the integer symbols.

25. The disk drive system defined in claim 22 wherein the modulation encoder converts the data block from the first base into the first integer in the second base using radix conversion.

* * * * *